(12) United States Patent
Heo et al.

(10) Patent No.: US 10,657,904 B2
(45) Date of Patent: May 19, 2020

(54) DISPLAY DEVICE

(71) Applicant: Samsung Display Co., Ltd., Yongin-si, Gyeonggi-do (KR)

(72) Inventors: Se Young Heo, Yongin-si (KR); Dong Ho Kim, Yongin-si (KR); Min Soo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1 day.

(21) Appl. No.: 15/861,583

(22) Filed: Jan. 3, 2018

(65) Prior Publication Data

US 2018/0204526 A1 Jul. 19, 2018

(30) Foreign Application Priority Data

Jan. 18, 2017 (KR) .......................... 10-2017-0008881

(51) Int. Cl.
| | |
|---|---|
| *G09G 3/34* | (2006.01) |
| *G06F 3/0488* | (2013.01) |
| *H05K 5/00* | (2006.01) |
| *H05K 5/03* | (2006.01) |
| *G09G 3/20* | (2006.01) |
| *G09G 5/10* | (2006.01) |
| *G09G 3/3208* | (2016.01) |

(52) U.S. Cl.
CPC .......... *G09G 3/3406* (2013.01); *G06F 3/0488* (2013.01); *G09G 3/20* (2013.01); *H05K 5/0017* (2013.01); *H05K 5/03* (2013.01); *G09G 3/3208* (2013.01); *G09G 5/10* (2013.01); *G09G 2320/0626* (2013.01); *G09G 2360/144* (2013.01)

(58) Field of Classification Search
CPC .......... G09G 3/30; G09G 3/32; G09G 3/3208; G09G 3/3225; G09G 3/3233; G09G 3/325; G09G 3/3258; G09G 3/3283; G09G 3/3291; G09G 2300/08; G09G 2300/0814; G09G 2300/0819; G09G 2300/0842; G09G 2310/0251; G09G 2310/0272; G09G 2310/061; G09G 2320/0257; G09G 2320/0252; G09G 2320/0233

See application file for complete search history.

(56) References Cited

U.S. PATENT DOCUMENTS

| | | | |
|---|---|---|---|
| 10,163,984 B1 * | 12/2018 | Ho | H01L 27/3216 |
| 2009/0102763 A1 * | 4/2009 | Border | H04N 7/144 345/87 |
| 2010/0165267 A1 * | 7/2010 | Yoshida | G02F 1/13318 349/106 |
| 2014/0132158 A1 * | 5/2014 | Land | G09G 3/20 315/152 |
| 2014/0183342 A1 * | 7/2014 | Shedletsky | G06F 1/1637 250/215 |
| 2016/0322600 A1 | 11/2016 | Ho et al. | |
| 2019/0043452 A1 * | 2/2019 | Silvanto | G06F 1/1688 |

* cited by examiner

*Primary Examiner* — Priyank J Shah
(74) *Attorney, Agent, or Firm* — Lewis Roca Rothgerber Christie LLP

(57) ABSTRACT

A display device includes: a base substrate having a first surface and a second surface opposite the first surface, the base substrate including a plurality of pixels on the first surface of the base substrate; a protective layer on the second surface of the base substrate, the protective layer having a first opening; a light sensor corresponding to the first opening; and a circuit board on the protective layer. The light sensor is mounted on the circuit board.

19 Claims, 5 Drawing Sheets

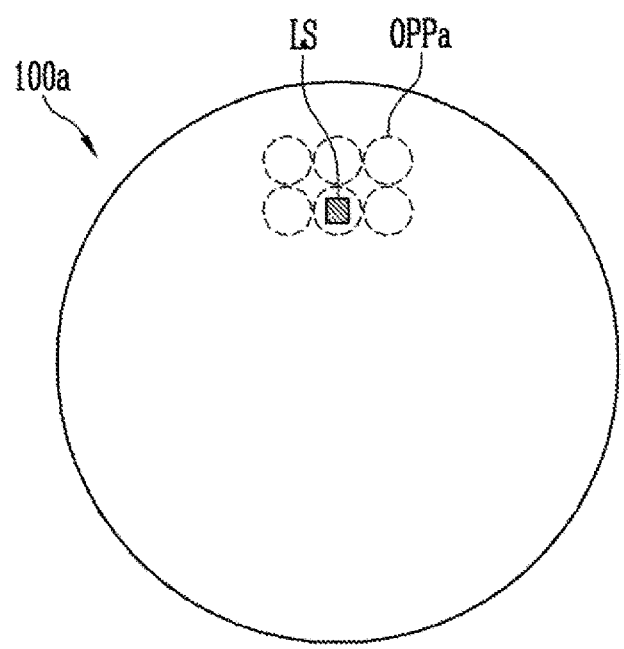
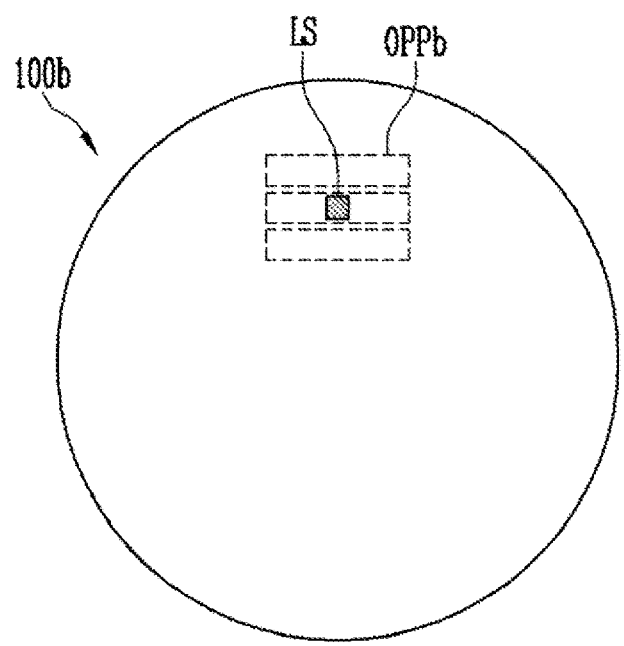

DISPLAY DEVICE

CROSS-REFERENCE TO RELATED APPLICATION

This application claims priority to and the benefit of Korean Patent Application No. 10-2017-0008881, filed on Jan. 18, 2017 in the Korean Intellectual Property Office, the entire disclosure of which is incorporated herein by reference.

BACKGROUND

1. Field

An aspect of an embodiment of the present disclosure relates to a display device.

2. Description of the Related Art

Portable terminals may include various display devices. Such display devices include, as some examples, a liquid crystal display, a field emission display, a plasma display panel, an organic light emitting display, and the like.

Recently, such portable terminals have been equipped with an illumination sensor to automatically adjust brightness of a display panel according to external illumination (e.g., according to an external environment illumination value). For example, the screen of a display may brighten (e.g., a brightness value of the display may increase) in relatively bright surroundings and may darken (e.g., the brightness value of the display may decrease) in relatively dark surroundings, thereby promoting efficient use of power.

However, when the illumination sensor is located at a back surface of the display panel, light must pass through the display panel before reaching a light sensor of the illumination sensor and transmittance therethrough may be very low.

SUMMARY

Embodiments of the present disclosure provide a display device having improved transmittance.

According to an embodiment of the present disclosure, a display device includes: a base substrate having a first surface and a second surface opposite the first surface, the base substrate including a plurality of pixels on the first surface of the base substrate; a protective layer on the second surface of the base substrate, the protective layer having a first opening; a light sensor corresponding to the first opening; and a circuit board on the protective layer. The light sensor is mounted on the circuit board.

The display device may further include a cover panel between the protective layer and the circuit board. The cover panel may have a second opening corresponding to the light sensor.

The display device may further include a condensing member that condenses light toward the light sensor, and the condensing member may be in at least one of the first opening and the second opening.

The display device may further include a reflecting member at a side surface of at least one of the first opening in the protective layer and the second opening in the cover panel.

The reflecting member may be formed by coating a metallic material on the side surface.

The first opening and the second opening may have the same width or diameter.

The display device may further include an encapsulating member covering the pixels.

The display device may further include a touch sensor on the encapsulating member.

The protective layer may have a plurality of opening patterns, and the first opening may be one of the opening patterns.

The pixels may define a display region of the base substrate, and the light sensor may be in the display region.

The light sensor may include an illumination sensor.

Each of the pixels may include an organic light emitting device.

The base substrate may have a circular shape.

According to another embodiment of the present disclosure, a display device includes: a base substrate having a first surface and a second surface opposite the first surface, the base substrate including a plurality of pixels on the first surface of the base substrate; an encapsulating member on the first surface of the base substrate over the pixels; a protective layer on the second surface of the base substrate, the protective layer having a first opening; a cover panel on a surface of the protective layer opposite the base substrate, the cover panel having a second opening; a circuit board on a surface of the cover panel opposite the protective layer; and a light sensor. The light sensor is on the circuit board, is in at least one of the first opening in the protective layer and the second opening in the cover panel, and is aligned with the first opening in the protective layer and the second opening in the cover panel. The first and second openings are aligned with each other in a direction normal to the first and second surfaces of the base substrate.

The display device may further include a lens aligned with the light sensor in the direction normal to the first and second surfaces of the base substrate, and the lens may be configured to focus external light to the light sensor.

The display device may further include a reflecting member at a side surface of at least one of the first opening in the protective layer and the second opening in the cover panel.

The reflecting member may include a thin metallic film.

The first opening and the second opening may have the same width or diameter.

The protective layer may have a plurality of opening patterns, and the first opening may be one of the opening patterns.

The base substrate may have a display region and a non-display region. The pixels may be arranged in the display region of the base substrate, and the light sensor may be in the display region of the base substrate.

According to embodiments of the present disclosure, an opening corresponding to the light sensor is formed in the protective layer on the back surface of a display panel so that transmittance through the display panel is improved, thereby enhancing the light sensing ability of the display device.

BRIEF DESCRIPTION OF THE DRAWINGS

Example embodiments of the present disclosure will now be described more fully hereinafter with reference to the accompanying drawings; however, the present disclosure may be embodied in different forms and should not be construed as limited to the exemplary embodiments set forth herein. Rather, these embodiments are provided so that this disclosure will be thorough and complete and will fully convey the scope of the present disclosure to those skilled in the art.

FIGS. 2A-2C are plan views illustrating opening patterns according to other embodiments of the present disclosure.

DETAILED DESCRIPTION

Figure 1A:
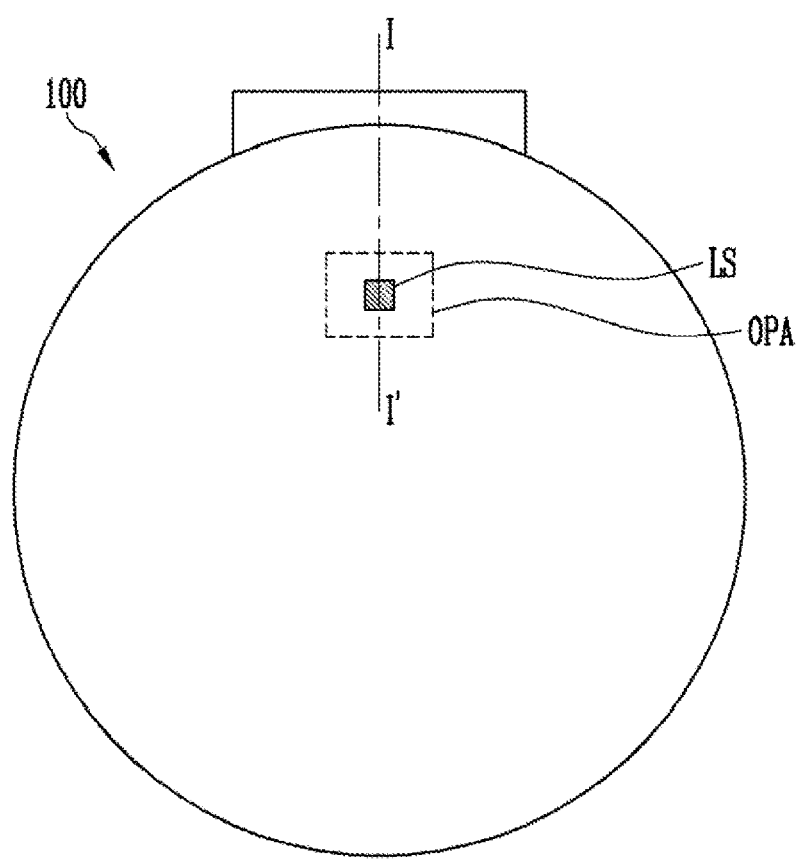
FIG. 1A is a plan view schematically illustrating a display device according to a first embodiment of the present disclosure.

Exemplary embodiments of the present disclosure are described below; however, the present disclosure may include various changes and different shapes. Therefore, the present disclosure should not be construed as being limited to the embodiments described herein.

In the figures, dimensions may be exaggerated for clarity of illustration. Like reference numerals refer to like elements throughout.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. It will be understood that when an element is referred to as being "between" two elements, it can be the only element between the two elements or one or more intervening elements may be present. As used herein, the term "and/or" includes any and all combinations of one or more of the associated listed items. Further, the use of "may" when describing embodiments of the present invention relates to "one or more embodiments of the present invention." Also, the term "exemplary" is intended to refer to an example or illustration. As used herein, the terms "use," "using," and "used" may be considered synonymous with the terms "utilize," "utilizing," and "utilized," respectively.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "having," "includes," "including," "comprises," and/or "comprising" when used in this specification, specify the presence of stated features, integers, steps, operations, elements, and/or components but do not preclude the presence and/or addition of one or more other features, integers, steps, operations, elements, components, and/or groups thereof. Further, an expression that an element, such as a layer, region, substrate, or plate, is "on" or "above" another element indicates not only an embodiment in which the element is "directly on" or "just above" the other element but also an embodiment in which a further element is interposed between the element and the other element. An expression that an element, such as a layer, region, substrate, or plate, is "beneath" or "below" another element indicates not only an embodiment in which the element is "directly beneath" or "just below" the other element but also an embodiment in which a further element is interposed between the element and the other element.

The various controllers and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the controllers may be formed on one integrated circuit (IC) chip or on separate IC chips. Further, the various components of the controllers may be implemented on a flexible printed circuit film, a tape carrier package (TCP), a printed circuit board (PCB), or formed on a same substrate as the controllers. Further, the various components of the controllers may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

Hereinafter, exemplary embodiments of the present disclosure will be described, in detail, with reference to the accompanying drawings.

Figure 1B:
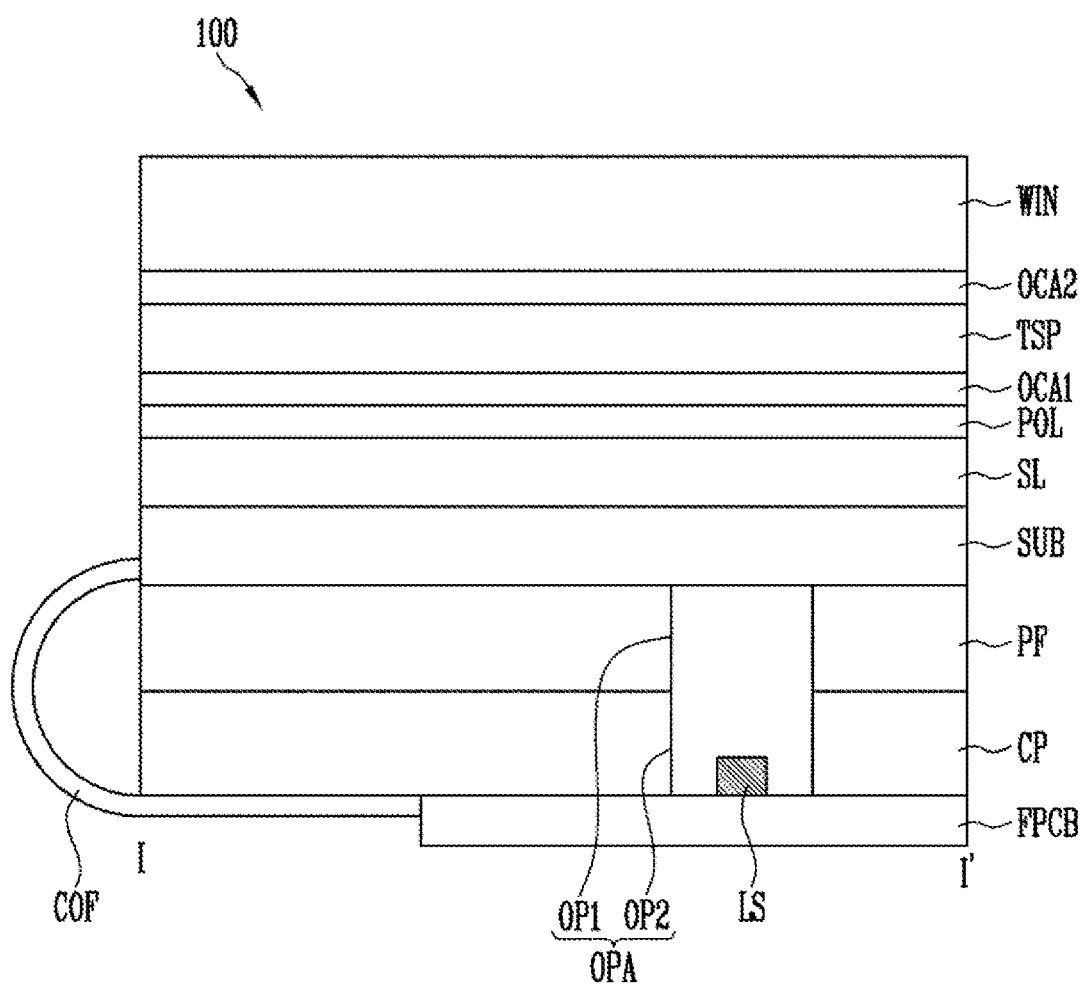
FIG. 1B is a sectional view schematically illustrating the display device according to the first embodiment of the present disclosure.

FIG. 1A is a plan view schematically illustrating a display device according to a first embodiment of the present disclosure. FIG. 1B is a sectional view schematically illustrating the display device according to the first embodiment of the present disclosure.

Referring to FIGS. 1A and 1B, a display device 100 includes a base substrate SUB, a protective layer PF, a light sensor LS, and a circuit board FPCB (e.g., a flexible printed circuit board). The display device 100 may further include a cover panel CP, a connecting member COF, an encapsulating member SL, a polarizing layer POL, a touch sensor TSP, and a window panel WIN.

A plurality of pixels for displaying an image are provided on one surface (a first surface) of the base substrate SUB. Each of the pixels is a minimum unit for displaying an image, and the pixels may be arranged in a matrix form. Each of the pixels may emit white light and/or colored light. Each of the pixels may include an organic light emitting device including an organic layer. However, the present disclosure is not limited thereto, and each of the pixels may be implemented in various suitable forms, such as a liquid crystal device, an electrophoretic device, and an electrowetting device.

The base substrate SUB may further include a driving circuit for driving the pixels. The driving circuit may include a data driver that supplies a data signal to the pixels, a gate driver that supplies a gate signal to the pixels, and a timing controller that controls operation timings of the data driver and the gate driver. When the driving circuit is formed on a separate chip to be connected to the base substrate SUB, the driving circuit may be provided in the form of a chip on glass or a chip on plastic.

The base substrate SB may be a non-rectangular panel. In the first embodiment, the base substrate SUB is a circular panel. The base substrate SUB may be made of an insulative material, such as glass or a resin. Also, the base substrate SUB may be made of a flexible or elastic material to be bendable or foldable. The base substrate SUB may have a single- or multi-layer structure.

For example, the base substrate SUB may include polystyrene, polyvinyl alcohol, poly methyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. However, the material of (or constituting) the base substrate SUB may be variously changed, and the base substrate SUB may be made of fiber glass reinforced plastic (FRP) or of other suitable materials.

The protective layer PF is provided on another surface (a second surface) of the base substrate SUB, and the protective layer PF includes a first opening OP1. For example, the protective layer PF is located on a surface opposite to the light emitting surface (the first surface) of the base substrate SUB on which the pixels are provided. The protective layer PF protects the base substrate SUB and may be a film to be attached to the base substrate SUB. For example, the thickness of the protective layer PF may be about 0.1 mm.

The first opening OP1 is formed at a position corresponding to (e.g., aligned with) the light sensor LS. In one embodiment, the size of the first opening OP1 is larger than that of the light sensor LS when viewed on a plane. Because the base substrate SUB and the protective layer PF are located along a path of external light that reaches the light sensor LS, light transmittance is relatively low (e.g., the transmittance of external light through the base substrate SUB and the protective layer PF is relatively low). However, the light transmittance is improved by the first opening OP1, which is obtained by removing a portion of the protective layer PF.

The light sensor LS is disposed corresponding to (e.g., aligned with) the first opening OP1. The light sensor LS is located at the other surface (the second surface) of the base substrate SUB. Also, the light sensor LS may be located in a display region in which the pixels are located. The light sensor LS may include an illumination sensor. The illumination sensor may measure an illumination value of an external environment. For example, the display device 100 may be configured to automatically adjust the brightness of an image according to the illumination value of the external environment that is measured by the light sensor LS.

The circuit board FPCB is provided on the protective layer PF, and the light sensor LS is mounted on the circuit board FPCB. The circuit board FPCB may be a flexible printed circuit board. The circuit board FPCB may include a light sensor controller that processes data detected by the light sensor LS. In an embodiment, the light sensor controller may be mounted in the form of a chip on film (COF) on the connecting member COF. In such an embodiment, one end of the connecting member COF may be connected to the base substrate SUB, and the other end of the connecting member COF may be connected to the circuit board FPCB.

The cover panel CP may be provided between the protective layer PF and the circuit board FPCB. The cover panel CP reinforces or improves a supporting force of the display device 100 and may be a plastic panel to be attached to the protective layer PF. For example, the thickness of the cover panel CP may be about 0.14 mm.

The cover panel CP includes a second opening OP2 corresponding to (e.g., aligned with) the light sensor LS. When the cover panel CP is made of an opaque material, the second opening OP2 is formed in the cover panel CP such that external light can reach the light sensor LS. An opening region OPA includes the first opening OP1 and the second opening OP2. When viewed on a plane, the first opening OP1 and the second opening OP2 may have the same or substantially the same size (e.g., a same width or diameter).

The encapsulating member SL is provided on the base substrate SUB to cover the pixels. The encapsulation member SL is shown as a single layer but may have a multi-layer structure. The encapsulating member SL may be made of an organic material and/or an inorganic material. The organic material may include organic insulating materials, such as a polyacryl-based compound, a polyimide-based compound, a fluorine-based compound, such as Teflon® (a registered trademark of E.I. Du Pont De Nemours and Company of Wilmington, Del.), and/or a benzocyclobutene-based compound. The inorganic material may include polysiloxane, silicon nitride, silicon oxide, silicon oxynitride, and the like.

The polarizing layer POL may be provided on the encapsulating member SL, and the touch sensor TSP may be provided on the polarizing layer POL. The touch sensor TSP and the polarizing layer POL may be adhered to each other using a first optically clear adhesive OCA1. In another embodiment, the touch sensor TSP may be directly formed on the encapsulating member SL. In still another embodiment, the touch sensor TSP may be provided in an in-cell manner between the base substrate SUB and the encapsulating member SL.

The touch sensor TSP may include a plurality of sensing electrodes for sensing a touch position. The sensing electrodes may be configured as a transparent conductive layer including, for example, indium tin oxide (ITO), indium zinc oxide (IZO), zinc oxide (ZnO), or indium tin zinc oxide (ITZO). Various structures and touch methods known in the art may be applied to the touch sensor TSP. For example, the touch sensor TSP may be configured as a resistive type, a capacitive type, a surface acoustic wave type, or an infrared type to sense a touch position.

The window panel WIN may be provided on the touch sensor TSP. The window panel WIN and the touch sensor TSP may be adhered to each other using a second optically clear adhesive OCA2. The window panel WIN may be made of an insulative material, such as glass or a resin. The window panel WIN may be made of a flexible or elastic material to be bendable or foldable. The window pane WIN may have a single- or multi-layer structure.

Figure 2C:
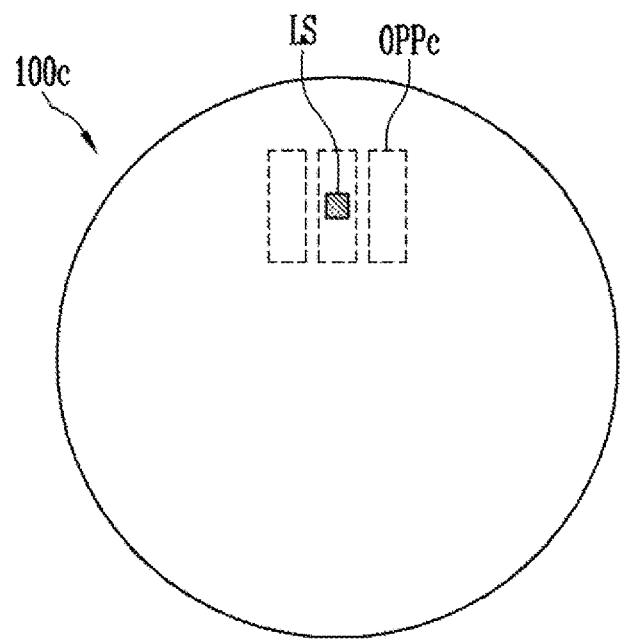

FIGS. 2A-2C are plan views illustrating opening patterns according to other embodiments of the present disclosure.

Hereinafter, descriptions of components substantially identical to those of the above-described embodiment may be omitted for convenience of explanation.

In display devices 100a, 100b, and 100c according to other embodiments, the opening in the protective layer PF has a plurality of different pattern shapes. For example, in the display device 100a shown in FIG. 2A, the protective layer PF includes circular opening patterns OPPa. In the display device 100b shown in FIG. 2B, the protective layer PF includes rectangular opening patterns OPPb (e.g., laterally-extending rectangular opening patterns). In the display device 100c shown in FIG. 2C, the protective layer PF includes longitudinally-extending rectangular opening patterns OPPc. As described above, the area of the opening region is increased by including a plurality of pattern shapes such that supporting force of the protective layer PF with respect to the base substrate SUB can be ensured while increasing light transmittance.

Figure 3:
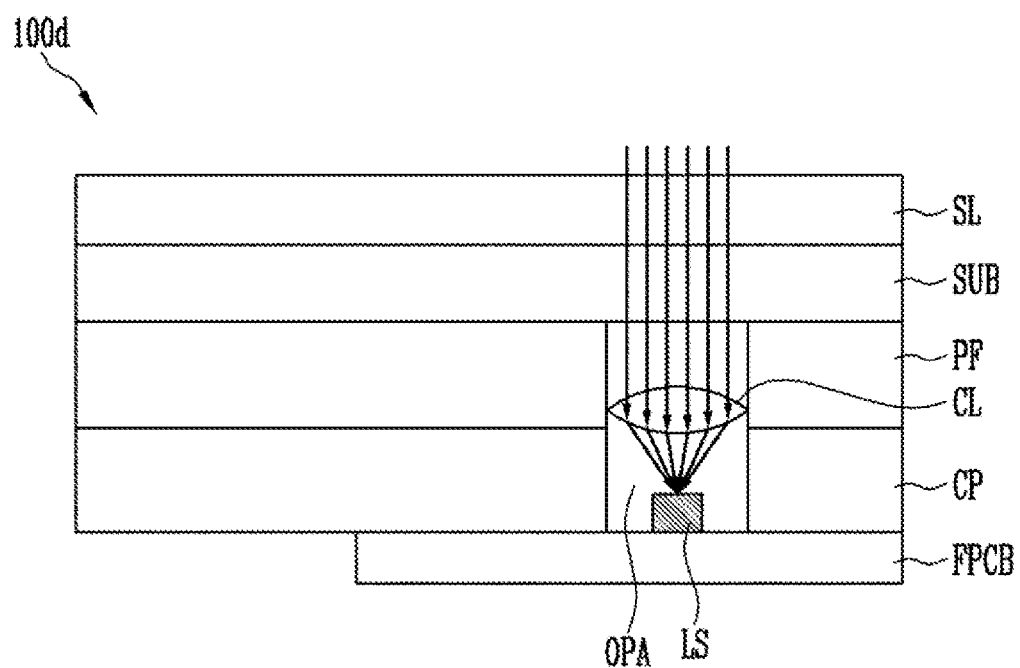
FIGS. 3 and 4 are sectional views schematically illustrating display devices according to other embodiments of the present disclosure.
Figure 4:
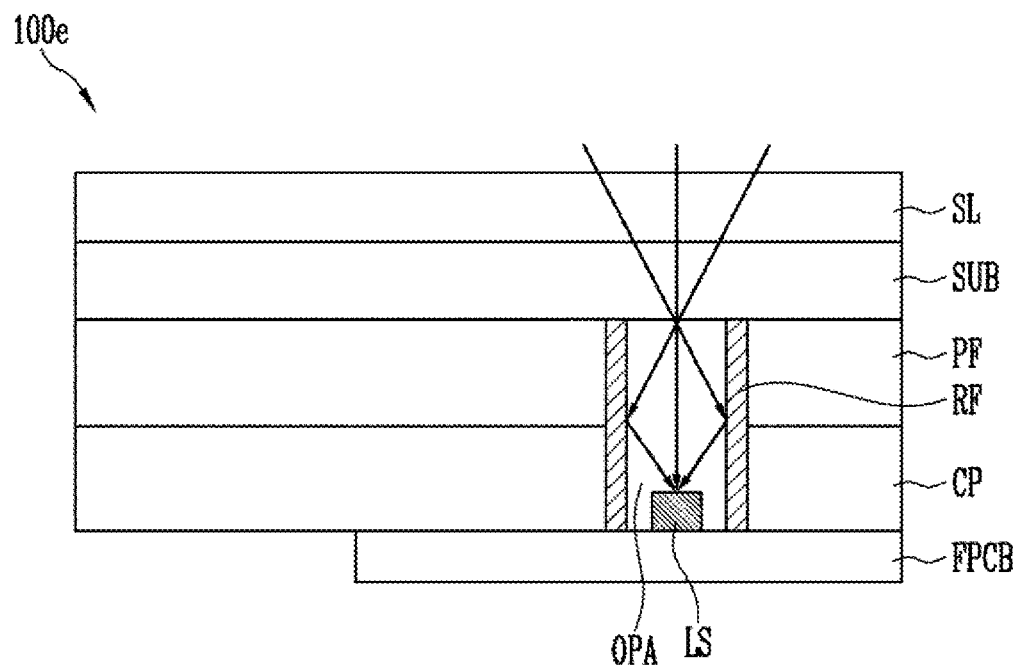

FIGS. 3 and 4 are sectional views schematically illustrating display devices according to other embodiments of the present disclosure.

Referring to FIG. 3, in a display device 100d, a condensing member CL (e.g., a lens) is provided in the opening region OPA to condense light toward the light sensor LS. External light passing through the opening region OPA can be condensed toward the light sensor LS by the condensing member CL, and accordingly, the light sensing ability of the light sensor LS is improved. For example, the condensing member CL may be a convex lens having a focus adjusted toward the light sensor LS.

Referring to FIG. 4, in a display device 100e, a reflecting member RF is provided at a side surface portion in the opening region OPA (e.g., at a side surface of the protective layer PF and the cover panel CP in the opening region OPA). External light passing through the opening region OPA is condensed toward the light sensor LS by the reflecting member RF, and accordingly, the light sensing ability of the light sensor LS is improved. For example, the reflecting member RF may be formed by coating a metallic material having high reflectance on the side surface portion in the opening region OPA.

As described above, according to embodiments of the present disclosure, an opening corresponding to the light sensor is formed in the protective layer on the back surface of a display panel so that transmittance of external light therethrough is improved, thereby improving the light sensing ability of the display device.

Example embodiments have been disclosed herein, and although specific terms are employed, they are used and are to be interpreted in a generic and descriptive sense and not for purpose of limitation. In some instances, as would be apparent to one of ordinary skill in the art, features, characteristics, and/or elements described in connection with one embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A display device comprising:
a base substrate having a first surface and a second surface opposite the first surface, the base substrate comprising a plurality of pixels on the first surface of the base substrate;
a protective layer on the second surface of the base substrate, the protective layer having a first opening;
a reflecting member at a side surface of the first opening in the protective layer;
a light sensor corresponding to the first opening; and
a circuit board on the protective layer, the light sensor being mounted on the circuit board.

2. The display device of claim 1, further comprising a cover panel between the protective layer and the circuit board, the cover panel having a second opening corresponding to the light sensor.

3. The display device of claim 2, further comprising a condensing member that condenses light toward the light sensor, the condensing member is in at least one of the first opening and the second opening.

4. The display device of claim 1, wherein the reflecting member is formed by coating a metallic material on the side surface.

5. The display device of claim 2, wherein the first opening and the second opening have the same width or diameter.

6. The display device of claim 1, further comprising an encapsulating member covering the pixels.

7. The display device of claim 6, further comprising a touch sensor on the encapsulating member.

8. The display device of claim 1, wherein the protective layer has a plurality of opening patterns, the first opening being one of the opening patterns.

9. The display device of claim 1, wherein the pixels define a display region of the base substrate, and
wherein the light sensor is in the display region.

10. The display device of claim 1, wherein the light sensor comprises an illumination sensor.

11. The display device of claim 1, wherein each of the pixels comprises an organic light emitting device.

12. The display device of claim 1, wherein the base substrate has a circular shape.

13. A display device comprising:
a base substrate having a first surface and a second surface opposite the first surface, the base substrate comprising a plurality of pixels on the first surface of the base substrate;
an encapsulating member on the first surface of the base substrate over the pixels;
a protective layer on the second surface of the base substrate, the protective layer having a first opening;
a cover panel on a surface of the protective layer opposite the base substrate, the cover panel having a second opening, the first and second openings being aligned with each other in a direction normal to the first and second surfaces of the base substrate;
a circuit board on a surface of the cover panel opposite the protective layer; and
a light sensor on the circuit board, in at least one of the first opening in the protective layer and the second opening in the cover panel, and aligned with the first opening in the protective layer and the second opening in the cover panel.

14. The display device of claim 13, further comprising a lens aligned with the light sensor in the direction normal to the first and second surfaces of the base substrate, the lens being configured to focus external light to the light sensor.

15. The display device of claim 13, further comprising a reflecting member at a side surface of the first opening in the protective layer and the second opening in the cover panel.

16. The display device of claim 15, wherein the reflecting member comprises a thin metallic film.

17. The display device of claim 13, wherein the first opening and the second opening have the same width or diameter.

18. The display device of claim 13, wherein the protective layer has a plurality of opening patterns, the first opening being one of the opening patterns.

19. The display device of claim 13, wherein the base substrate has a display region and a non-display region, the pixels being arranged in the display region of the base substrate, and wherein the light sensor is in the display region of the base substrate.

* * * * *